United States Patent [19]

Fujiwara et al.

[11] Patent Number: 4,892,594

[45] Date of Patent: Jan. 9, 1990

[54] PHOTOVOLTAIC ELEMENT

[75] Inventors: Ryoji Fujiwara, Kamakura; Minori Yamaguchi, Akashi; Isamu Shimizu, Yokohama, all of Japan

[73] Assignees: Canon Kabushiki Kaisha, Tokyo; Kanegafuchi Chemical Industry Co., Ltd., Osaka, both of Japan

[21] Appl. No.: 253,890

[22] Filed: Oct. 5, 1988

Related U.S. Application Data

[63] Continuation of Ser. No. 106,924, Oct. 7, 1987, abandoned, which is a continuation of Ser. No. 871,167, Jun. 3, 1986, abandoned, which is a continuation of Ser. No. 703,486, Feb. 20, 1985, abandoned.

[30] Foreign Application Priority Data

Feb. 23, 1984 [JP] Japan .................... 59-33003

[51] Int. Cl.$^4$ ............................. H01L 31/06
[52] U.S. Cl. ....................... 136/258; 357/30; 357/59
[58] Field of Search ............ 136/258 AM; 357/30 J, 357/30 K, 59 C

[56] References Cited

U.S. PATENT DOCUMENTS

| 4,535,195 | 8/1985 | Morimoto et al. | 136/261 |
| 4,689,438 | 8/1987 | Fukatsu et al. | 136/256 |

FOREIGN PATENT DOCUMENTS

| 0155106 | 9/1985 | European Pat. Off. | 136/258 AM |
| 56-93376 | 7/1981 | Japan | 136/258 AM |
| 59-17287 | 1/1984 | Japan | 136/258 AM |
| 60-258975 | 12/1985 | Japan | 136/258 AM |
| 62-05073 | 1/1987 | Japan | 136/258 AM |

Primary Examiner—Aaron Weisstuch
Attorney, Agent, or Firm—Fitzpatrick, Cella Harper & Scinto

[57] ABSTRACT

A photovoltaic element comprises a p-type layer comprising a p-type transition metal oxide, an active layer comprising an amorphous silicon, a n-type layer comprising an amorphous silicon containing a n-type impurity, and an electrode.

7 Claims, 1 Drawing Sheet

PHOTOVOLTAIC ELEMENT

This application is a continuation of application Ser. No. 106,924, filed Oct. 7, 1987, now abandoned, which in turn is a continuation of Ser. No. 871,167, filed June 3, 1986, now abandoned, which in turn is a continuation of Ser. No. 703,486, filed Feb. 20, 1985, now abandoned.

BACKGROUND OF THE INVENTION

1. Field of the Invention

This invention relates to a photovoltaic element with a novel structure capable of generating a photovoltaic effect with good efficiency by stimulation from electromagnetic waves such as UV-rays, visible light, and IR-rays, particularly sunlight.

2. Description of the Prior Art

In the prior art, studies have been made about those photovoltaic elements employing single crystal or polycrystalline silicon (written as C-Si), GaAs, InP, CdTe, and CuInSe$_2$, and some of them have been used in practical applications. Particularly, in recent years, hydrogenated amorphous silicon (written as "a-Si:H") has attracted attention as a material for forming a photovoltaic element, with the advantage of being capable of p and n type doping, in addition to easy area enlargement due to the use of amorphous material. The reason why photovoltaic elements employing a-Si:H have actively been studied is that a-Si:H inherently provides various advantages as mentioned below:

(1) Because a-Si:H is amorphous in nature, the selection rule is not valid for its light absorption; therefore its light absorption coefficient is very great. It exhibits sufficient light absorption even with a thickness of about 1/200 of that of conventional C-Si.

(2) Since sufficient light absorption can be exhibited even with a thin thickness, only small amounts of starting material for preparation of thin film are required, which will lead to conservation of energy.

(3) p and n doping control can be accomplished by a relatively simple method. For example, if a gas such as PH$_3$ or B$_2$H$_6$ is mixed into the starting SiH$_4$ gas, P or B can be sufficiently incorporated into the thin film during the glow discharge decomposition reaction, whereby a n-type or p-type semiconductor thin film can be formed.

(4) Due to lower production cost and production energy, cost repayment and energy repayment of the photovoltaic element itself can be done within a short period of time, whereafter a net energy gain will be obtained.

As for the structures of the known photovoltaic elements employing a-Si:H, there are (1) the Schottky barrier type, (2) the metal/insulating layer/aSi:H type, (3) the p-i-n junction type of a-Si:H, etc. Concerning the former two types, due to utilization of a metal as a surface electrode, light reflectance from the surface is generally large and the quantity of light reaching the semiconductor layer is limited by the species of metal employed and the deposited thickness of the metal, thereby lowering of efficiency. Accordingly, the structure which is now being developed with good progress is the p-i-n type photovoltaic element of type (3). The element structure, including its electrodes, has been reported variously and is typically of the metal/n-i-p structure/ITO/glass type or the ITO/n-i-p structure/-metal type. One of the most important tasks for photovoltaic element improvement is that of photoelectric transducing efficiency. According to a recent report, there has been obtained a thin film solar battery with an efficiency of over 10 %. Such improvement in efficiency may be attributable to removal of impurities from the i layer and improvement in spectral sensitivity. By imparting a "window effect" by use of an a-SiC or a-SiN layer on the light irradiating side of an element, improvement in spectral sensitivity as well as prevention of inverse diffusion of carriers may be effected. Also, as a means for preventing contamination by an impurity in the i layer, it has been proposed to utilize a three-compartment separation type reaction device. While utilization of a-SiC or a-SiN for improvement of spectral sensitivity is a great step forward, even use of these as a window layer will make it possible only with difficulty to broaden the spectral sensitivity to include the entire wavelength region of sunlight or a room lamp. In other words, a wide band gap material with no light absorption is ideally desirable as the window layer, but use of a completely transparent film of a-SiC or a-SiN as the window layer has so far resulted in lowering of photoelectric transducing efficiency of the element as a whole. Thus, a problem remains in the presently available a-Si:H photovoltaic element with respect to blue sensitivity. Further, for improvement of transducing efficiency of photovoltaic elements, it is also necessary to lower the series resistance of the element. For these reasons, even in the case of a-SiC or a-SiN, in spite of much efforts paid to p and n doping control, control of optical band gap (Eog), and lowering of resistance, problems remain to be solved.

SUMMARY OF THE INVENTION

The present invention has been accomplished in view of the various points described above and an object of the present invention is to provide a photovoltaic element having a novel structure which has overcome various problems of the a-Si:H photovoltaic elements of the prior art. Another object of the present invention is to provide a photovoltaic element which has been dramatically enhanced in photoelectric transducing efficiency as compared with the elements of the prior art. Still another object of the present invention is to provide a photovoltaic element which has improved spectral sensitivity. Further, still another object of the present invention is to provide a photovoltaic element comprising a p-type layer comprising a p-type transition metal oxide, an active layer comprising an amorphous silicon, an n-type layer comprising an amorphous silicon containing an n-type impurity, and an electrode.

DESCRIPTION OF THE PREFERRED EMBODIMENTS

Figure 1:
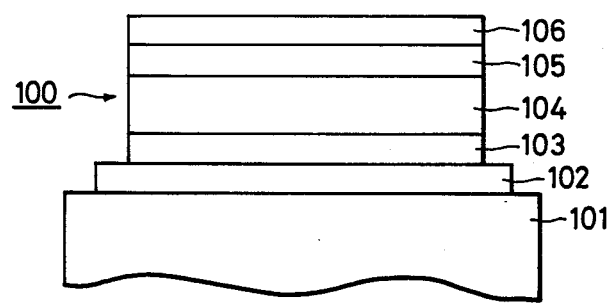
FIG. 1 shows schematically a sectional view of the layer constitution of an embodiment of the photovoltaic element of the present invention.

As the p-type transition metal oxide constituting the p-type layer as the window layer in the photovoltaic element of the present invention, there may be included oxides of the so-called d-transition metals, particularly desirably those of the excess oxygen type. In the present invention, d-transition metals which can effectively accomplish the objects of the invention include metals belonging to group VI B of the periodic table such as Cr, etc., or metals belonging to group VIIIB of the periodic table such as Ni, Co, Fe, Ir, etc. Low-oxygen oxides of these metals are colored black to brown, but sufficient oxidation to the extent of the excess oxygen will change the color to pale blue to pale green, whereby it is rendered possible to form a layer in a thickness range of 20 Å to 10000 Å, which can transmit light with a broad range of wavelength from 300 nm to 1000 nm with good efficiency. We have found that power can be outputted with good efficiency by making a p-i-n type photovoltaic element with a layer structure in which a p-type layer of a p-type transition metal oxide and an active layer of a-Si:H are laminated. It is believed that the hetero-junction between the p-type layer of the p-type transition metal oxide and the a-Si:H active layer, due to the amorphous nature of the a-Si:H active layer, is small in distortion at the junction, whereby good transport of carriers may be maintined. Also, the ratio of trap recombination of carriers in the p-type layer, the active layer, and the interface therebetween can be sufficiently decreased. Hetero-junctions can also be formed similarly as in the present invention even when a-SiN or a-SiC of the prior art is employed. However, the great difference between the present invention and such prior art lies in the use of a p-type transition metal oxide containing no Si for the p-type layer. By this, it is rendered possible to obtain a photovoltaic element having the following advantages:

(1) dramatic improvement of light transmittance through the p-type layer as the window layer;

(2) reduction in series resistance; and (3) high Voc. Typical examples of the p-type transition metal oxide to be effectively used in the present invention may include $NiOx_1$, $CrOx_2$, $IrOx_2$, $CoOx_4$ and $FeOx_5$.

Preferable ranges of $x_1-x_5$ for accomplishing the objects of the present invention are $1.0 \leq x_1 < 1.5$, $1.5 \leq x_2 < 2.0$, $1.5 \leq x_3$, $< 2.0$, $1.0 \leq x_4 \leq 1.5$ and $1.5 \leq x_5 < 2.0$, respectively. In the present invention, the p-type transition metal oxide should desirably contain hydrogen atoms, and the content of hydrogen atoms may preferably be 0.01 to 50 atomic %, more preferably 0.1 to 45 atomic % per one metal atom. Referring now to the drawing shown in FIG. 1, an embodiment of the photovoltaic element of the present invention will be explained in detail. The photovoltaic element 100 shown in FIG. 1 is constituted of an electroconductive layer 102, a p-type layer 103 of a p-type transition metal oxide, an active layer 104 of an a-Si:H intrinsic semiconductor, an n-type layer 105 of a $n^+$type a-Si:H and an electrode 106 provided on a substrate 101. The electroconductive layer 102 is not necessarily required when the substrate 101 is made of an electroconductive material such as metals. However, when the p-type layer 103 is provided on the side of the substrate 101 relative to the active layer 104, it is desirable to use a substrate made of a material transmissive to light such as glass, transparent ceramics, etc., and therefore an electrode 102 made of a light transmissive electroconductive material is provided on these light transmissive substrates. Of course, in the case of a photovoltaic element with a layer structure, in which the p-type layer 103 and the n-type layer 105 are reversed in order of lamination with respect to the active layer 104, electromagnetic waves for stimulating the active layer 104 are incident on the side of the electrode 106, and therefore the substrate 101 can be opaque.

The p-type layer of a p-type transition metal oxide can be prepared according to diverse methods, including typically the resistance heating vacuum vapor deposition method, the reactive sputtering method, the electron beam heating vapor deposition method, the MOCVD method, etc., and it is possible to select a suitable one as desired in conformity with the purpose. More specifically, when a p-type layer of a p-type transition metal oxide is to be prepared, the optimum method may be selected in view of the melting point of its oxide, metal, or metal compound, reactivity with oxygen, decomposition rate or other factors, and the electron beam heating vapor deposition method or the reactive sputtering method is preferably employed as the effective method in most cases. The MOCVD (Metal Organic Chemical Vapour Deposition) method is also one of the ueful methods, because a p-type layer with excellent characteristics can be prepared, although available starting materials are limited. As an example, referring to preparation of a p-type layer according to the reactive sputtering method, a process for the preparation of a photovoltaic element and the element structure will be explained below. First, on an electroconductive substrate, a p-type transition metal oxide is deposited. As the electroconductive substrate, there may be effectively employed an opaque material such as aluminum, stainless steel, gold, palladium, copper, copper alloys, silver, etc. or materials to be made translucent to opaque by deposition of these electroconductive materials on an insulating material such as glass of flexible films of heat-resistant polymer films, or transparent electroconductive substrates such as glass/ITO, glass/ITO/$SnO_2$, etc.

Deposition of a p-type transition metal oxides on the above electroconductive substrate is effected by sputtering a metal target (e.g. Ni, Cr, Ir, etc.) in an oxygen atmosphere according to the reactive sputtering method. The p-type layer should have a thickness preferably of 20 to 5000, more preferably of 20 to 2000 Å, most preferably of 50 to 1000 Å. On the p-type layer, an a-Si:H intrinsic semiconductor active layer is deposited by, for example, glow discharge decomposition of $SiH_4$, to a thickness preferably of 1000 to 20000 Å, more preferably of 3000 to 10000 Å, followed further by deposition of an n-type a-Si:H by, for example, glow discharge decomposition of $SiH_4$ plus $PH_3$, to a thickness preferably of 50 to 2000 Å, more preferably of 100 to 1000 Å, to prepare a photovoltaic element with a p-i-n structure. As the surface electrode, transparent ITO, $SnO_2$, or translucent to opaque metal such as Al, Cr, Pd, Ni, nickel-chromium alloys, copper alloys, etc. may be formed by resistance heating vapor deposition, electron beam heating vapor deposition, sputtering vapor deposition, etc. The present invention is described in more detail by referring to the following Examples, by which, however, the present invention is not limited.

EXAMPLE 1

As shown in FIG. 1, on a glass substrate 101 coated on its surface with a transparent electroconductive film 102, an iridium oxide film (IrOx) 103 was formed to a thickness of about 0.02 μm. The iridium oxide film 103 was formed according to the high frequency sputtering method in an oxygen atmosphere by use of a target of iridium metal. The iridium oxide film 103 was preparedd under the conditions of sputtering pressure of 27 Pa and high frequency power of 0.4 W/cm$^2$ to give a film having a transmittance of 90 % or higher and a DC conductivity of 10 $\Omega \cdot cm^{-1}$. As the next step, on the iridium oxide film 103, an intrinsic a-Si:H layer 104 was formed to a thickness of 0.7 μm by flow discharge decomposition of silane ($SiH_4$), followed by formation of an n+a-Si:H layer 105 to a thickness of 0.02 μm by doping with phosphine (PH$_3$), followed by formation of a transparent electroconductive film 106 at the upper portion, to prepare a p-i-n type photovoltaic element 100. The characteristics of this element under AM1 exhibited an open circuit voltage Voc of 0.9 V and a short circuit current Jsc of 15 mA/cm$^2$, with the fill factor FF being 0.7.

EXAMPLE 2

Example 1 was repeated except that an amorphous chromium trioxide film (a-Cr$_2$O$_3$,) was formed to a thickness of 0.02 μm in place of the iridium oxide film 102. The chromuim trioxide film was prepared according to the electron beam vapor deposition method using a pellet prepared by compression molding of Cr$_2$O$_3$, powder as the vaporization source. The resulting amorphous chromium trioxide film had a transmittance of o75 % and a DC conductivity of $10^{-5}\Omega\cdot cm^{-1}$, but further improvements of transmittance and DC conductivity were observed by adding steam during vapor deposition or carrying out reactive ion plating using steam as the reactive gas.

By making a structure otherwise the same as in Example 1, the characteristics of Voc=1.5 V, Jsc=5 mA/cm$^2$ and FF=0.5 were obtained under irradiation of AM1.

EXAMPLE 3

A photovoltaic element was prepared according to the same procedure as in Example 1, except a thin nickel oxyhydroxide film [NiO$_x$(OH)$_y$]to a thickness of 0.02 μm was formed in place of the iridium oxide film. Otherwise, the structure was made the same as that in Example 1. The above thin nickel oxyhydroxide film was prepared according to the reactive ion plating method using a compression molded pellet of powdery nickel oxide (NiO) or a metallic nickel pellet as the vaporization source and steam as the reactive gas. The nickel oxyhydroxide film obtained thereby had a transmittance of 95 % and a DC conductivity of $10^{-4}\Omega\cdot cm^{-1}$.

The element was found to exhibit FF =0.4 at Voc =0.7 V and Jsc=8 mA/cm$^2$.

We claim:

1. A photovoltaic element having a p-i-n laminated structure on a substrate, comprising in sequence:
   a first electroconductive layer;
   a transparent iridium oxide layer having a thickness of 20 to 5000 Å and p-type conductivity;
   a hydrogenated amorphous silicon active layer having a thickness of 1000–20,000 Å and i-type conductivity;
   a hydrogenated amorphous silicon layer having a thickness of 50 to 2000 Å and n-type conductivity; and
   a second electrocondouctive layer.

2. A photovoltaic element according to claim 1, wherein the n-type layer contains a dopant impurity selected from the atoms belonging to the group VA of the periodic table.

3. A photovoltaic element according to claim 1, wherein the substrate is flexible.

4. A photovoltaic element according to claim 1, wherein the p-type iridium oxide contains hydrogen atoms.

5. A photovoltaic element according to claim 4, wherein the content of hydrogen atoms is 0.01 atomic % to 50 atomic % per one metal atom.

6. A photovoltaic element according to claim 1, wherein the iridium oxide has the formula: -

$IrO_{x_3}$ $(1.5 \leq x_3 \leq 2.0.)$

7. A photovoltaic element according to claim 6, wherein the iridium oxide further contains hydrogen atoms.

* * * * *

UNITED STATES PATENT AND TRADEMARK OFFICE
CERTIFICATE OF CORRECTION

PATENT NO. : 4,892,594
DATED : January 9, 1990
INVENTOR(S) : RYOJI FUJIWARA ET AL.           Page 1 of 2

It is certified that error appears in the above-identified patent and that said Letters Patent is hereby corrected as shown below:

COLUMN 2

Line 38, "art. Another" should read --art. ¶ Another--.
    Line 42, "Still" should read --¶ Still--.
    Line 44, "sensitivity. Further," should read
        --sensitivity. ¶ Further,--.
    Line 62, "type. In" should read --type. ¶ In--.
    Line 67, "etc. Low-oxygen" should read
        --etc. ¶ Low-oxygen--.

COLUMN 3

Line 4, italics should be deleted.
    Line 5, italics should be deleted.
    Line 6, "efficiency. We" should read
        --efficiency. ¶ We--.
    Line 18, "decreased. Hetero-junctions" should read
        --decreased. ¶ Hetero-junctions--.
    Line 29, "Voc. Typical" should read --Voc. ¶ Typical--.
    Line 35, "$1.5 \leqq x_2 < 2.0, 1.5 \leqq x_3, < 2.0,$" should read
        --$1.5 \leqq x_2 \leqq 2.0, 1.5 \leqq x_3, \leqq 2.0,$--.
    Line 36, "$1.5 \leqq x_5 < 2.0$ respectively. In" should read
        --$1.5 \leqq x_5 \leqq 20$, respectively. ¶ In--.
    Line 40, "atom. Referring" should read
        --atom. ¶ Referring--.

UNITED STATES PATENT AND TRADEMARK OFFICE
CERTIFICATE OF CORRECTION

PATENT NO. : 4,892,594
DATED : January 9, 1990
INVENTOR(S) : RYOJI FUJIWARA ET AL.    Page 2 of 2

It is certified that error appears in the above-identified patent and that said Letters Patent is hereby corrected as shown below:

COLUMN 4

Line 13, "ueful" should read --useful--.
    Line 19, "below. First," should read --below. ¶ First,--.

Line 35, "5000 ," should read --5000 Å,--.
    Line 62, "redd" should read --red--.
    Line 67, "flow discharge" should read --glow discharge--.

COLUMN 5

Line 19, "o75 %" should read --75%--.

COLUMN 6

Line 17, "electrocondouctive" should read
            --electroconductive--.

Signed and Sealed this

Twenty-sixth Day of May, 1992

Attest:

DOUGLAS B. COMER

Attesting Officer    Acting Commissioner of Patents and Trademarks